United States Patent
Tanwar et al.

(10) Patent No.: US 8,883,631 B1
(45) Date of Patent: Nov. 11, 2014

(54) METHODS OF FORMING CONDUCTIVE STRUCTURES USING A SACRIFICIAL MATERIAL DURING A METAL HARD MASK REMOVAL PROCESS

(71) Applicant: GLOBALFOUNDRIES Inc., Grand Cayman (KY)

(72) Inventors: Kunaljeet Tanwar, Slingerlands, NY (US); Xunyuan Zhang, Albany, NY (US); Xiuyu Cai, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 9 days.

(21) Appl. No.: 13/905,271

(22) Filed: May 30, 2013

(51) Int. Cl.
*H01L 21/4763* (2006.01)
*H01L 21/768* (2006.01)

(52) U.S. Cl.
CPC .................. *H01L 21/76838* (2013.01)
USPC .............. 438/633; 438/626; 438/631

(58) Field of Classification Search
CPC .................................................. H01L 21/76838
USPC .......................................... 438/626, 631, 633
See application file for complete search history.

(56) References Cited

U.S. PATENT DOCUMENTS

| | | | |
|---|---|---|---|
| 2005/0070093 A1* | 3/2005 | Barns et al. | 438/637 |
| 2006/0258147 A1* | 11/2006 | Colburn et al. | 438/622 |
| 2006/0267208 A1* | 11/2006 | Colburn et al. | 257/774 |
| 2007/0125750 A1* | 6/2007 | Weng et al. | 216/67 |
| 2011/0241167 A1* | 10/2011 | Feustel et al. | 257/532 |
| 2012/0187546 A1* | 7/2012 | Akinmade-Yusuff et al. | 257/622 |
| 2012/0273851 A1* | 11/2012 | Hong | 257/288 |
| 2013/0337586 A1* | 12/2013 | Iizumi et al. | 438/16 |

* cited by examiner

*Primary Examiner* — Alexander Ghyka
(74) *Attorney, Agent, or Firm* — Amerson Law Firm, PLLC (57) ABSTRACT

One illustrative method disclosed herein includes forming at least one layer of insulating material above a conductive structure, forming a patterned hard mask comprised of metal above the layer of insulating material, performing at least one etching process to define a cavity in the layer of insulating material, forming a layer of sacrificial material so as to overfill the cavity, performing at least one planarization process to remove a portion of the layer of sacrificial material and the patterned hard mask while leaving a remaining portion of the layer of sacrificial material within the cavity, and removing the remaining portion of the layer of sacrificial material positioned within the cavity.

28 Claims, 6 Drawing Sheets

METHODS OF FORMING CONDUCTIVE STRUCTURES USING A SACRIFICIAL MATERIAL DURING A METAL HARD MASK REMOVAL PROCESS

BACKGROUND OF THE INVENTION

1. Field of the Invention

Generally, the present disclosure relates to the manufacture of semiconductor devices, and, more specifically, to various methods of forming conductive structures, such as conductive contacts and conductive lines/vias, using a sacrificial material during the process of removing a metal hard mask layer used in forming such conductive structures.

2. Description of the Related Art

The fabrication of advanced integrated circuits, such as CPUs, storage devices, ASICs (application specific integrated circuits) and the like, requires a large number of circuit elements, such as transistors, capacitors, resistors, etc., to be formed on a given chip area according to a specified circuit layout. During the fabrication of complex integrated circuits using, for instance, MOS (Metal-Oxide-Semiconductor) technology, millions of transistors, e.g., N-channel transistors (NFETs) and/or P-channel transistors (PFETs), are formed on a substrate including a crystalline semiconductor layer. A field effect transistor, irrespective of whether an NFET transistor or a PFET transistor is considered, typically includes doped source and drain regions that are formed in a semiconducting substrate and separated by a channel region. A gate insulation layer is positioned above the channel region and a conductive gate electrode is positioned above the gate insulation layer. By applying an appropriate voltage to the gate electrode, the channel region becomes conductive and current is allowed to flow from the source region to the drain region.

To improve the operating speed of field effect transistors (FETs), and to increase the density of FETs on an integrated circuit device, device designers have greatly reduced the physical size of FETs over the past decades. More specifically, the channel length of FETs has been significantly decreased, which has resulted in improving the switching speed of FETs and the overall functionality of the circuit. Further scaling (reduction in size) of the channel length of transistors is anticipated in the future. While this ongoing and continuing decrease in the channel length of transistor devices has improved the operating speed of the transistors and integrated circuits that are formed using such transistors, there are certain problems that arise with the ongoing shrinkage of feature sizes that may at least partially offset the advantages obtained by such feature size reduction. For example, as the channel length is decreased, the pitch between adjacent transistors likewise decreases, thereby increasing the density of transistors per unit area. This scaling also limits the size of the conductive contact elements and structures, which has the effect of increasing their electrical resistance. In general, the reduction in feature size and increased packing density makes everything more crowded on modern integrated circuit devices.

Typically, due to the large number of circuit elements and the required complex layout of modern integrated circuits, the electrical connections of the individual circuit elements cannot be established within the same level on which the circuit elements, such as transistors, are manufactured. Rather, modern integrated circuit products have multiple so-called metallization layer levels that, collectively, contain the "wiring" pattern for the product, i.e., the conductive structures that provide electrical connection to the transistors and the circuits, such as conductive vias and conductive metal lines. In general, the conductive metal lines are used to provide intra-level (same level) electrical connections, while inter-level (between levels) connections or vertical connections are referred to as vias. In short, the vertically oriented conductive via structures provide the electrical connection between the various stacked metallization layers. Accordingly, the electrical resistance of such conductive structures, e.g., lines and vias, becomes a significant issue in the overall design of an integrated circuit product, since the cross-sectional area of these elements is correspondingly decreased, which may have a significant influence on the effective electrical resistance and overall performance of the final product or circuit.

Improving the functionality and performance capability of various metallization systems has also become an important aspect of designing modern semiconductor devices. One example of such improvements is reflected in the increased use of copper metallization systems in integrated circuit devices and the use of so-called "low-k" dielectric materials (materials having a dielectric constant less than about 3) in such devices. Copper metallization systems exhibit improved electrical conductivity as compared to, for example, prior metallization systems that used tungsten for the conductive lines and vias. The use of low-k dielectric materials tends to improve the signal-to-noise ratio (S/N ratio) by reducing crosstalk, as compared to other dielectric materials with higher dielectric constants. However, the use of such low-k dielectric materials can be problematic as they tend to be less resistant to metal migration as compared to some other dielectric materials, they tend to be mechanically weaker than other common insulating materials, such as silicon dioxide, that have a higher dielectric constant and they may be more susceptible to chemical attack from various solutions that they are exposed to during processing operations.

Figure 1A:
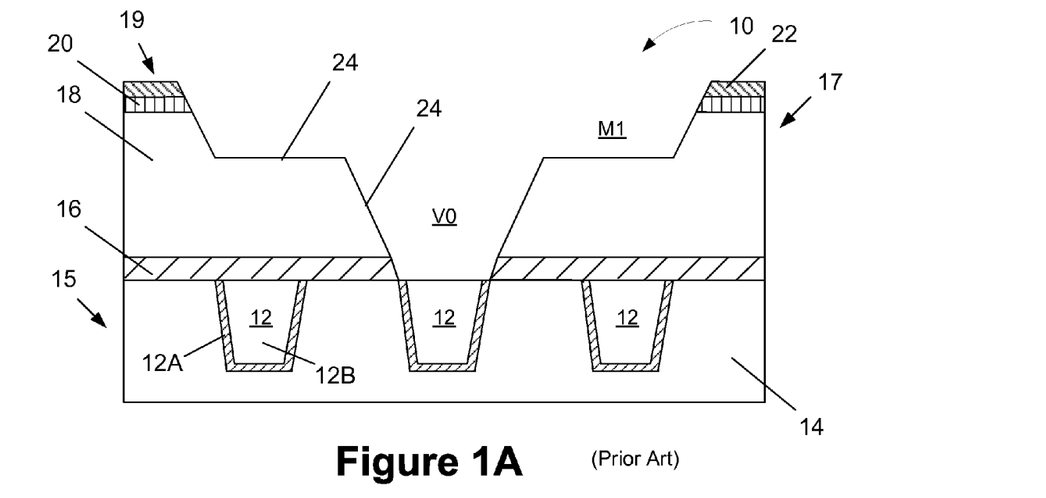
FIGS. 1A-1B depict one illustrative prior art method of forming conductive structures to the contact level of an integrated circuit product using a damascene process.
Figure 1B:
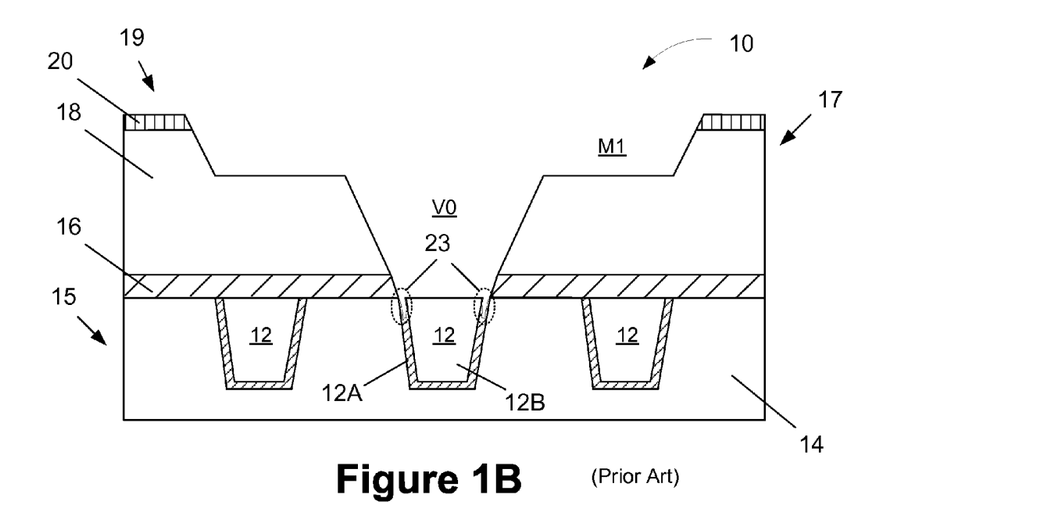

One such problem will be discussed with reference FIGS. 1A-1B, which depicts one illustrative prior art method of forming conductive structures to the contact level of an integrated circuit product using a damascene process. FIG. 1A depicts an integrated circuit product 10 comprised of a plurality of illustrative conductive contacts 12 formed in a layer of insulating material 14. The conductive contacts 12 are formed in the contact level of the product 10. Typically, the conductive contacts 12 are conductively coupled to a region or portion of a semiconductor device (not shown), such as the gate electrode and/or the source/drain regions of a transistor device. In the depicted example, each of the conductive contacts 12 may be comprised of one or more barrier layers or liners 12A, e.g., titanium nitride, and a bulk conductive material 12B, e.g., tungsten. An etch stop layer 16 is formed above the layer of insulating material 14. The layers 14, 16 and the conductive contacts 12 may all be considered to be part of the contact level layer 15 of the integrated circuit product 10. Electrical connections have to be made to the conductive contacts 12 for the product 10 to operate. Thus, another metallization layer 17 is formed above the contact level layer 15. In the depicted example, formation of the metallization layer 17 involves the formation of the first conductive via (V0) and an illustrative metal line of the first metallization layer (M1). As noted above, the product 10 will typically comprise several metallization layers, e.g., multiple layers of conductive vias and conductive lines. The M1 metallization layer is typically the first major "wiring" layer that is formed on the product 10. Formation of the V0 and M1 conductive structures involves formation of a layer of insulating material 18 and an etch mask 19 comprised of first and second layers of material 20, 22. In one example, the layers of insulating material 14, 18 may be layers of so-called low-k (k value less than about 3.3) insulating material, the layer 16 may be a layer of silicon nitride, NBlok, etc., the layer 20 may be a TEOS-based layer of silicon dioxide, and the layer 22 may be a hard mask made of a metal, such as titanium nitride. The thickness of these various layers of material may vary depending upon the particular application.

FIG. 1A depicts the product 10 after several process operations have been performed. First, using known photolithography and etching techniques, a patterned photoresist mask (not shown) was formed above the product 10 and the mask layer 19 was patterned as depicted. Thereafter, the photoresist mask was removed and one or more etching processes were performed through the patterned mask layer 19 to form the depicted via openings 24 through the layers 18, 16 so as to expose the underlying conductive contact 12.

After the openings 24 are formed as depicted in FIG. 1A, the metal hard mask layer 22 is removed. FIG. 1B depicts the product 10 after another etching process, such as a wet etching process, was performed to remove the metal hard mask layer 22. Unfortunately, during this etching process, portions of the barrier layer 12A are also attacked and consumed, as reflected by the loss of the material of the barrier layer 12A within the enclosed dashed lines 23. In some cases, such as where the barrier layer 12A and the metal hard mask layer 22 are made of the same material, the problem may be more pronounced. Loss of barrier layer 12A materials can result in problems such as undesirable migration of materials from the bulk conductive material 12B into the insulating layer 14 and the creation of undesirable voids when subsequently formed conductive structures are formed above the damaged regions 23.

Figure 2A:
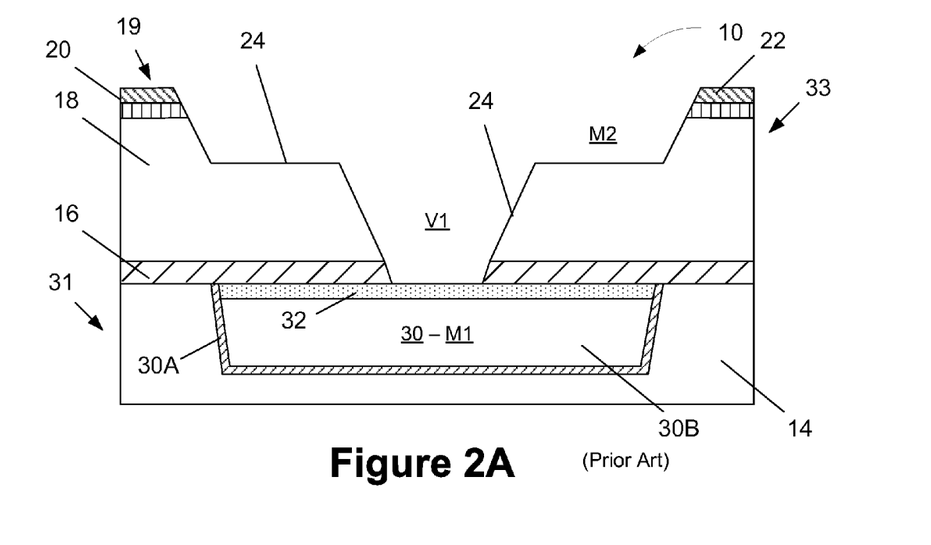
FIGS. 2A-2B depict another illustrative prior art method of forming conductive structures between metallization layers of an integrated circuit product using a damascene process.
Figure 2B:
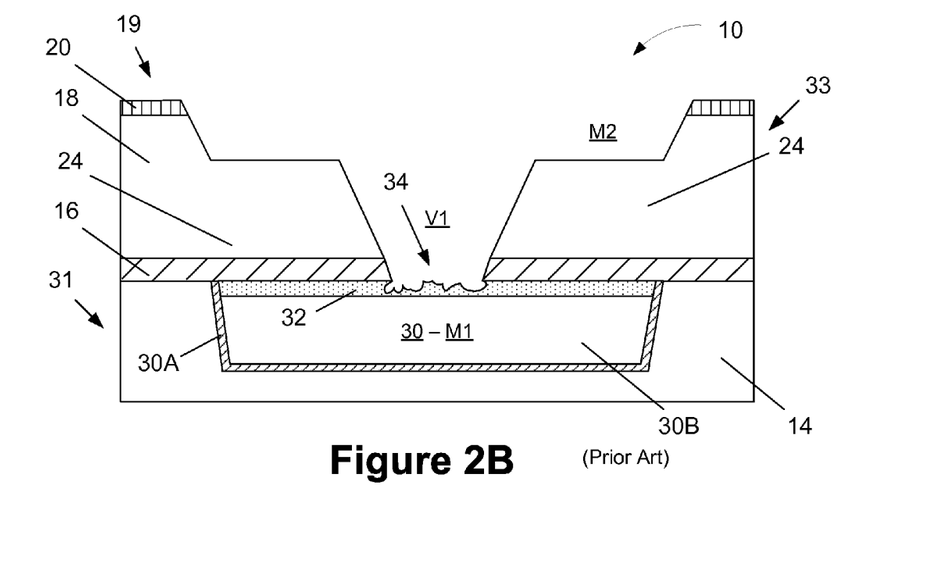

FIGS. 2A-2B depict another illustrative prior art method of forming conductive structures between metallization layers of an integrated circuit product using a damascene process. FIG. 2A depicts the integrated circuit product 10 wherein a M1 metallization layer 31 is formed in the layer of insulating material 14. In the depicted example, a metal line 30 is formed in the layer of insulating material 14. Typically, the metal line 30 is comprised of one or more barrier layers or liners 30A, e.g., tantalum/tantalum nitride, cobalt/tantalum nitride, ruthenium/tantalum nitride, and a bulk conductive material 30B, e.g., copper. In this example, a selectively deposited conductive cap layer 32, e.g., cobalt or manganese, is formed above the bulk conductive material 30B. As before, the etch stop layer 16 is formed above the layer of insulating material 14. Thus, another metallization layer 33, e.g., the M2 metallization layer, is formed above the M1 metallization layer 31. In the depicted example, formation of the metallization layer 33 involves the formation of a conductive via (V1) and an illustrative metal line of the M2 metallization layer. Formation of the V1 and M2 conductive structures involves formation of the above-described layer of insulating material 18 and etch mask 19 comprised of the first and second layers of material 20, 22.

FIG. 2A depicts the product 10 after several process operations have been performed. First, using known photolithography and etching techniques, a patterned photoresist mask (not shown) was formed above the product 10 and the mask layer 19 was patterned as depicted. Thereafter, the photoresist mask was removed and one or more etching processes were performed through the patterned mask layer 19 to form the depicted via openings 24 through the layers 18, 16 so as to expose the underlying metal line 30.

After the openings 24 are formed as depicted in FIG. 2A, the metal hard mask layer 22 is removed. FIG. 2B depicts the product 10 after another etching process, such as a wet etching process, was performed to remove the metal hard mask layer 22. Unfortunately, during this etching process, portions of the conductive cap layer 32 are also attacked and consumed, as reflected by the loss of the material of the conductive cap layer 32, as indicated by the arrow 34. Loss of material of the conductive cap layer 32 when subsequently formed conductive structures are formed above the damaged regions 34 can also be problematic, as noted above. Another problem is moisture can be absorbed by a ULK layer of insulating material 14 when it is exposed to a wet etch process. The moisture will increase the k value of the layer of insulating material 14 and can adversely impact TDDB.

The present disclosure is directed to various methods of forming conductive structures using a sacrificial material during the process of removing a metal hard mask layer used in forming such conductive structures that may solve or at least reduce some of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive structures, such as conductive contacts and conductive lines/vias, using a sacrificial material during the process of removing a metal hard mask layer used in forming such conductive structures. One illustrative method disclosed herein includes forming at least one layer of insulating material above a conductive structure, forming a patterned hard mask comprised of metal above the at least one layer of insulating material, performing at least one etching process through the patterned hard mask to define a cavity in the at least one layer of insulating material, wherein the cavity exposes at least a portion of the conductive structure, forming a layer of sacrificial material so as to overfill the cavity and cover the exposed portion of the conductive structure, performing at least one planarization process to remove a portion of the layer of sacrificial material and the patterned hard mask while leaving a remaining portion of the layer of sacrificial material within the cavity, and removing the remaining portion of the layer of sacrificial material positioned within the cavity so as to thereby expose the exposed portion of the conductive structure.

Another illustrative method disclosed herein includes forming at least one layer of insulating material having a k value less than 3.3 above a conductive structure, forming a patterned hard mask comprised of metal above the at least one layer of insulating material, performing at least one etching process through the patterned hard mask to define a cavity in the at least one layer of insulating material, wherein the cavity exposes at least a portion of the conductive structure, forming a layer of sacrificial material so as to overfill the cavity and cover the exposed portion of the conductive structure, performing at least one chemical mechanical polishing process to remove a portion of the layer of sacrificial material and the patterned hard mask while leaving a remaining portion of the layer of sacrificial material within the cavity, and removing the remaining portion of the layer of sacrificial material positioned within the cavity so as to thereby expose the exposed portion of the conductive structure.

Yet another illustrative method disclosed herein includes forming at least one layer of insulating material having a k value less than 3.3 above a conductive structure, forming a patterned hard mask comprised of metal above the at least one layer of insulating material, performing at least one etching process through the patterned hard mask to define a cavity in the at least one layer of insulating material, wherein the cavity exposes at least a portion of the conductive structure, forming a layer of sacrificial material comprised of flowable oxide so as to overfill the cavity and cover the exposed portion of the conductive structure, performing at least one chemical mechanical polishing process to remove a portion of the layer of sacrificial material and the patterned hard mask while leaving a remaining portion of the layer of sacrificial material within the cavity, and removing the remaining portion of the layer of sacrificial material positioned within the cavity so as to thereby expose the exposed portion of the conductive structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming conductive structures, such as conductive contacts and conductive lines/vias, using a sacrificial material during the process of removing a metal hard mask layer used in forming such conductive structures. As will be readily apparent to those skilled in the art upon a complete reading of the present application, the methods disclosed herein may be employed when forming conductive structures that contact a variety of different semiconductor devices, e.g., transistors, memory cells, resistors, etc., and may be employed when forming conductive structures for a variety of different integrated circuit products, including, but not limited to, ASIC's, logic devices, memory devices, etc. With reference to the attached drawings, various illustrative embodiments of the methods disclosed herein will now be described in more detail.

Figure 3A:
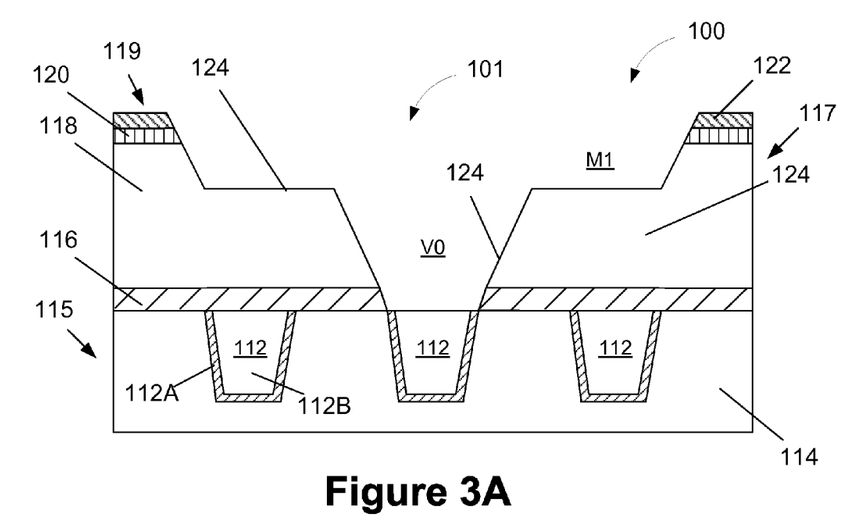
FIGS. 3A-3D depict one illustrative method disclosed herein of forming conductive structures using a sacrificial material during the process of removing a metal hard mask layer used in forming such conductive structures.

FIGS. 3A-3D depict one illustrative method disclosed herein of forming conductive structures using a sacrificial material during the process of removing a metal hard mask layer used in forming such conductive structures. FIG. 3A is a simplified view of an illustrative integrated circuit device 100 at an early stage of manufacturing that is formed above a semiconductor substrate (not shown). The substrate may have a variety of configurations, such as a bulk substrate configuration, an SOI (silicon-on-insulator) configuration, and it may be made of materials other than silicon. Thus, the terms "substrate" or "semiconductor substrate" should be understood to cover all semiconducting materials and all forms of such materials. The device 100 may be any type of integrated circuit device that employs any type of a conductive structure, such as a contact or a conductive line or via, commonly found on integrated circuit devices. The conductive structures depicted, described and claimed in this application are intended to be representative in nature as they may represent any type of conductive feature or structure on an integrated circuit product. In the examples depicted herein, the conductive structures are depicted as having a representative barrier and/or adhesion layer. In practice, there may be one or more such barrier/adhesion layers used in a real-world device. The conductive structures described and discussed herein may be made of any type of conductive material, e.g., a metal or a metal alloy, such as copper or a copper-based material.

FIG. 3A depicts an integrated circuit product 100 comprised of a plurality of illustrative conductive contacts 112 formed in a layer of insulating material 114. The conductive contacts 112 are formed in the contact level of the product 100. Typically, the conductive contacts 112 are conductively coupled to a region or portion of a semiconductor device (not shown), such as the gate electrode and/or the source/drain regions of a transistor device. In the depicted example, each of the conductive contacts 112 may be comprised of one or more barrier layers or liners 112A, e.g., titanium nitride, and a bulk conductive material 112B, e.g., tungsten. An etch stop layer 116 is formed above the layer of insulating material 114. The layers 114, 116 and the conductive contacts 112 may all be considered to be part of the contact level layer 115 of the integrated circuit product 100. Electrical connections have to be made to the conductive contacts 112 for the product 100 to operate. Thus, another metallization layer 117 is formed above the contact level layer 115. In the depicted example, formation of the metallization layer 117 involves the formation of the first conductive via (V0) and an illustrative metal line of the first metallization layer (M1). The product 100 will typically comprise several metallization layers, e.g., multiple layers of conductive vias and conductive lines.

Formation of the V0 and M1 conductive structures involves formation of a layer of insulating material 118 and an etch mask 119 comprised of first and second layers of material 120, 122. In one example, the layers of insulating material 114, 118 may be layers of so-called low-k (k value less than about 3.3) insulating material, the layer 116 may be a layer of silicon nitride, NBlok, etc., the layer 120 may be a TEOS-based layer of silicon dioxide, and the layer 122 may be a hard mask made of a metal, such as titanium, titanium nitride, etc. The layers of material depicted in FIG. 3A may be formed by performing a variety of known processing techniques, such as a chemical vapor deposition (CVD) process, an atomic layer deposition (ALD) process, a physical vapor deposition (PVD) process, or plasma enhanced versions of such processes, and the thickness of such layers may vary depending upon the particular application.

FIG. 3A depicts the product 100 after several process operations have been performed. First, using known photolithography and etching techniques, a patterned photoresist mask (not shown) was formed above the product 100 and the mask layer 119 was patterned as depicted. Thereafter, the photoresist mask was removed and one or more etching processes were performed through the patterned mask layer 119 to form the depicted openings 124 through the layers 118, 116 so as to expose the underlying conductive contact 112. The shape and size of the openings 124 depicted in the attached drawing is representative in nature, as the number, size and shape of the openings 124 may vary depending upon the particular application. In some embodiments where the presently disclosed inventions may be employed, only a single opening may be formed in the layer of insulating material 118, instead of the stepped, dual openings 124 depicted in FIG. 3A. Thus, the opening(s) 124 will generically be referred to as a cavity 101 irrespective of the size or shape of the opening(s) 124 or the manner in which they are formed.

Figure 3B:
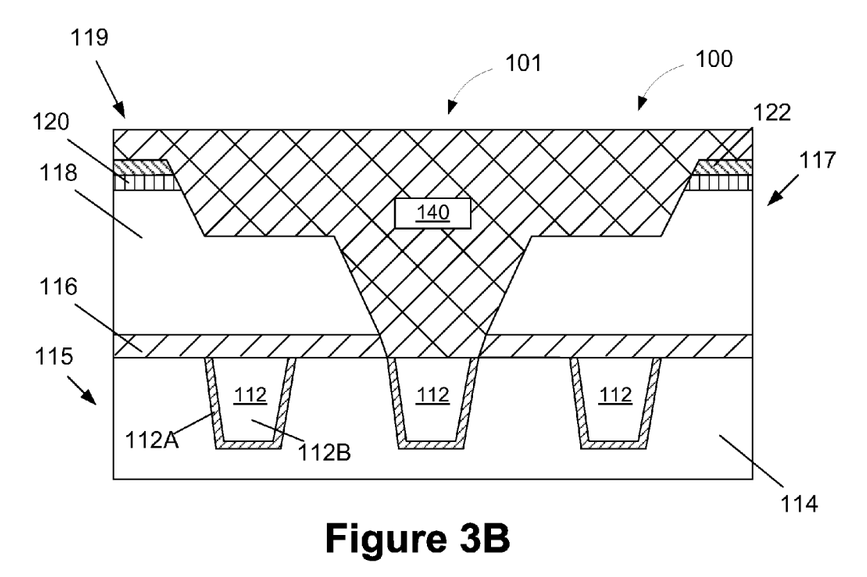

After the cavity 101 is formed, the metal hard mask layer 122 is to be removed. FIG. 3B depicts one illustrative embodiment of the product 100 after a sacrificial material layer 140 is formed so as to over-fill the cavity 101. In one illustrative embodiment, the sacrificial material layer 140 may be comprised of any of a variety of so-called bottom-up gap fill materials such as, for example, a flowable oxide material, etc. Depending upon the material selected for the sacrificial material layer 140, it may be formed using a variety of known processing techniques. In the case where the sacrificial material layer 140 is a flowable oxide material, the sacrificial material layer 140 may be formed by performing a spin coating/curing process, a CVD process, etc.

Figure 3C:
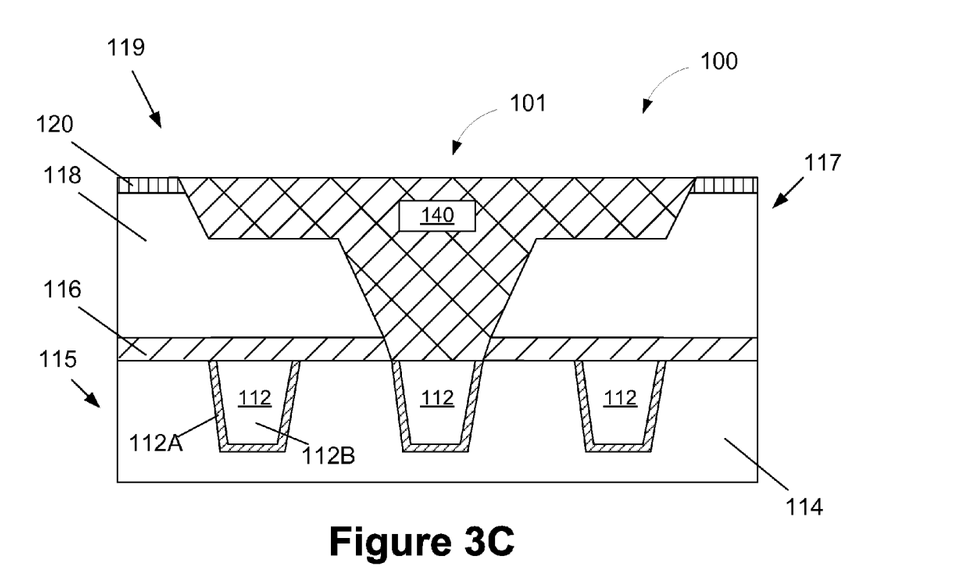

FIG. 3C depicts the product after at least one planarization process, e.g., a chemical mechanical polishing (CMP) process, is performed that stops on or within the layer of insulating material 120. These CMP process operations result in the removal of the patterned metal hard mask layer 122. In one illustrative example, a first polishing process is performed that stops on the patterned metal hard mask layer 122. Then, a timed CMP process is performed that stops on or within the layer of insulating material 118 so as to thereby remove the patterned metal hard mask layer 122. During the CMP process(es), the sacrificial material layer 140 that remains within the cavity 101 protects the layers of insulating material 118, 116 from being exposed to the slurries used in the CMP process. Another benefit to having the sacrificial material layer 140 positioned within the cavity 101 is that it will block the exposure of the layer of insulating material 118, e.g., a ULK material, to wet chemicals or slurries, which may tend to reduce or eliminate moisture absorption by the layer of insulating material 118 during various process operations described herein. Performing the CMP process to remove the patterned metal hard mask layer 122 without the sacrificial material layer 140 being present in the cavity 101 would lead to slurry particles being stuck in the cavity 101 that cannot be readily or easily removed.

Figure 3D:
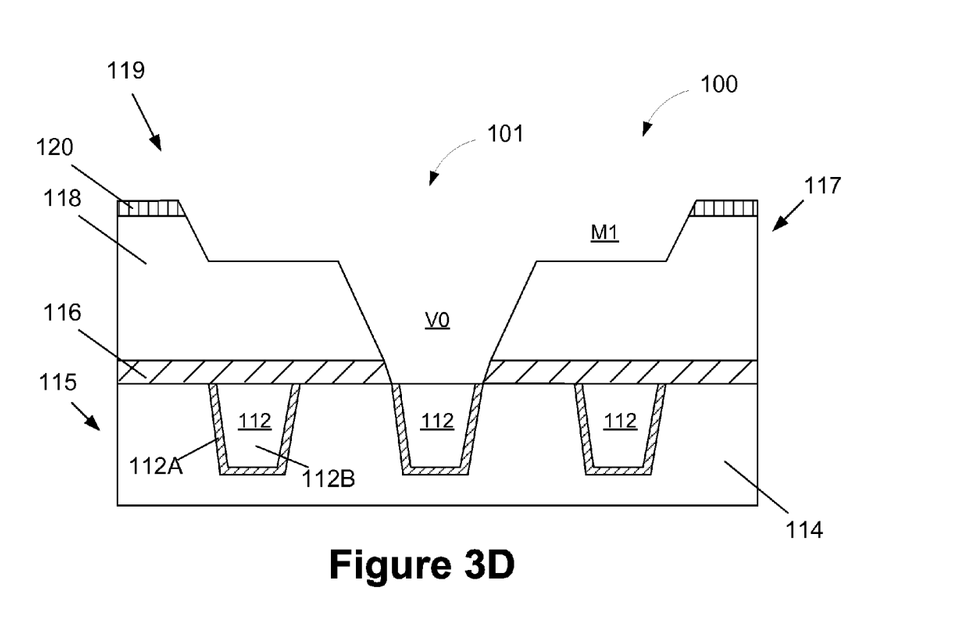

FIG. 3D depicts the product 100 after the remaining portions of the sacrificial material layer 140 have been removed from the cavity 101. Depending upon the material selected for the sacrificial material layer 140, the process used to remove the sacrificial material layer 140 may be such that it has little, if any, adverse effect on the layers of insulating material 118, 116. For example, in the case where the sacrificial material layer 140 is comprised of flowable oxide, it may be removed by using a dilute HF acid cleaning/rinsing process. Note that, unlike the prior art process depicted in FIGS. 1A-1B, by removing the patterned hard mask layer 122 using the above-described CMP process(es) with the sacrificial material layer 140 in position within the cavity 101, the conductive contacts 112 are not attacked during the removal of the patterned hard mask layer 122. At this point in the process flow described herein, traditional manufacturing operations may be performed to form one or more conductive materials in the cavity 101 so as to thereby define the V0 and M1 conductive structures. In general, the V0 and M1 structures may be formed by performing one or more deposition processes to deposit one or more layers of barrier materials and or seed layers, e.g., a copper seed layer, above the product 100 and in the cavity 101, and performing a bulk deposition process to overfill the opening with additional conductive material, such as bulk copper formed by performing an electroplating or an electroless deposition process. Thereafter, the product 100 is subjected to one or more CMP processes to remove excess materials positioned outside of the cavity 101.

Figure 4A:
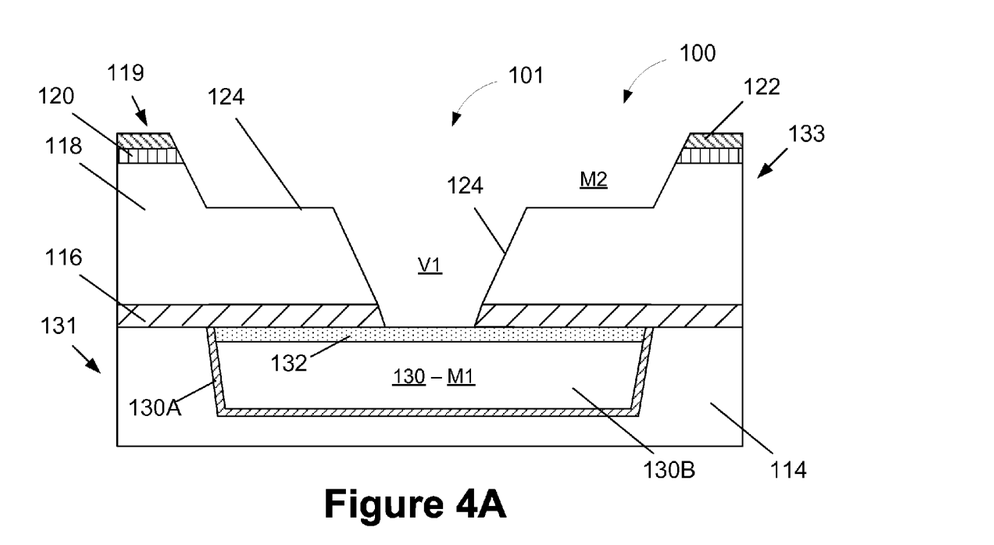
FIGS. 4A-4D depict another illustrative method disclosed herein of forming conductive structures using a sacrificial material during the process of removing a metal hard mask layer used in forming such conductive structures.

FIGS. 4A-4D depict another illustrative method disclosed herein of forming conductive structures using a sacrificial material during the process of removing a metal hard mask layer used in forming such conductive structures. FIG. 4A depicts the integrated circuit product 100 wherein a M1 metallization layer 131 is formed in the layer of insulating material 114. In the depicted example, a metal line 130 is formed in the layer of insulating material 114. Typically, the metal line 130 is comprised of one or more barrier layers or liners 130A, e.g., tantalum/tantalum nitride, cobalt/tantalum nitride, and a bulk conductive material 130B, e.g., copper. In this example, the metal line 130 is also comprised of a selectively deposited conductive cap layer 132, e.g., cobalt or manganese, formed above the bulk conductive material 130B, although such a conductive cap layer may not be present in all applications. As before, the etch stop layer 116 is formed above the layer of insulating material 114. Thus, another metallization layer 133, e.g., the M2 metallization layer, is formed above the M1 metallization layer 131. In the depicted example, formation of the metallization layer 133 involves the formation of a conductive via (V1) and an illustrative metal line of the M2 metallization layer 133.

Formation of the V1 and M2 conductive structures in the metallization layer 133 involves formation of the above-described layer of insulating material 118 and the etch mask 119 comprised of the first and second layers of material 120, 122.

FIG. 4A depicts the product 100 after several process operations have been performed. First, as described above, the illustrative openings 124 were formed to define the cavity 101 that exposes at least a portion of the metal line 130. As before, the shape and size of the cavity 101 formed in the layer or layers of insulating material may vary depending upon the particular application.

Figure 4B:
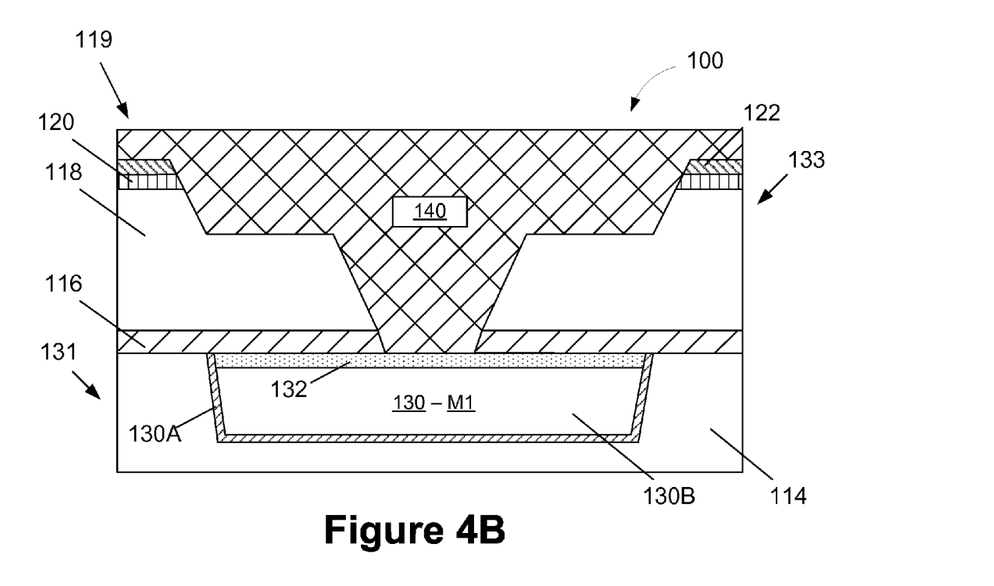
Figure 4C:
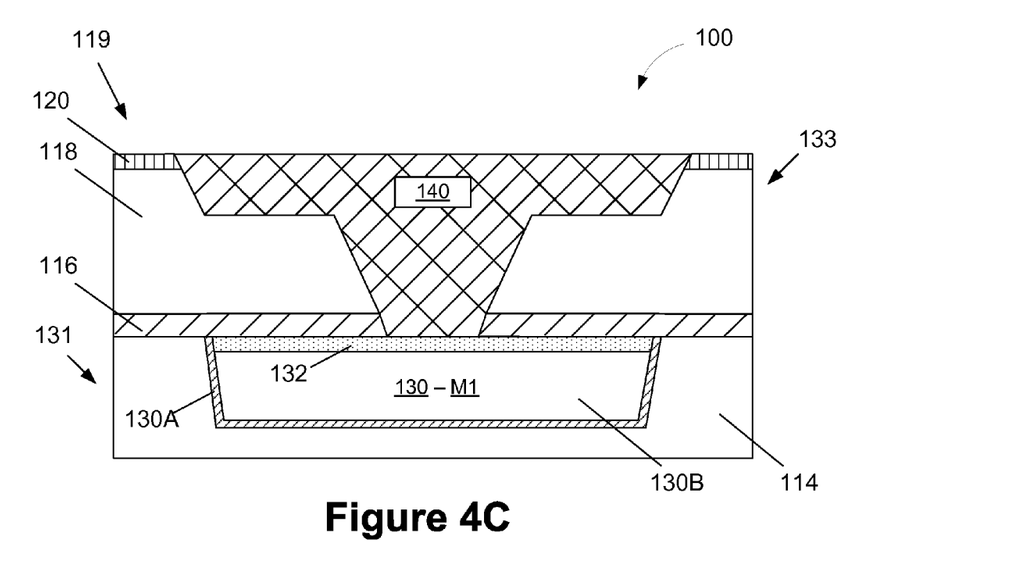
Figure 4D:
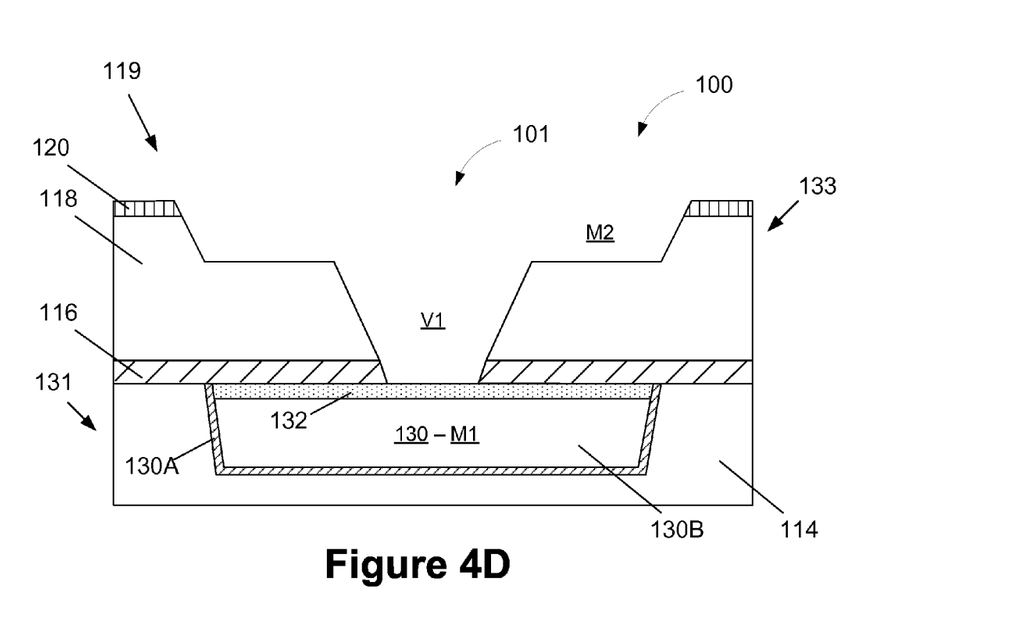

After the cavity 101 is formed, the metal hard mask layer 122 is to be removed. FIG. 4B depicts the product 100 after the above-described sacrificial material layer 140 was formed so as to over-fill the cavity 101. FIG. 4C depicts the product 100 after at least one planarization process, e.g., a chemical mechanical polishing (CMP) process, was performed that stops on or within the layer of insulating material 120. The patterned metal hard mask layer 122 is removed during this CMP process. As noted previously, during the CMP process, the sacrificial material layer 140 that remains within the cavity 101 protects the layers of insulating material 118, 116 from being exposed to the slurries used in the CMP process. FIG. 4D depicts the product 100 after the remaining portions of the sacrificial material layer 140 have been removed from the cavity 101. Depending upon the material selected for the sacrificial material layer 140, the process used to remove the sacrificial material layer 140 may be such that it has little, if any, adverse effect on the layers of insulating material 118, 116. Note that, unlike the prior art process depicted in FIGS. 2A-2B, by removing the patterned hard mask layer 122 using the above-described CMP process(es) with the sacrificial material layer 140 in position within the cavity 101, the metal line is not attacked during the removal of the patterned hard mask layer 122. At this point in the process flow described above, traditional manufacturing operations may be performed to form one or more conductive materials in the cavity 101 so as to thereby define the V1 and M2 conductive structures.

As should be clear from the foregoing, the novel methods disclosed herein provide an efficient and effective means of forming conductive structures in integrated circuit products that may solve or at least reduce some of the problems identified in the background section of this application. Note that the use of terms such as "first," "second," "third" or "fourth" to describe various processes in this specification and in the attached claims is only used as a shorthand reference to such steps and does not necessarily imply that such steps are performed in that ordered sequence. Of course, depending upon the exact claim language, an ordered sequence of such processes may or may not be required.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming at least one layer of insulating material above a conductive structure;
   forming a patterned hard mask comprised of metal above said at least one layer of insulating material;
   performing at least one etching process through said patterned hard mask to define a cavity in said at least one layer of insulating material, wherein said cavity exposes at least a portion of said conductive structure;
   forming a layer of sacrificial material so as to overfill said cavity and cover said exposed portion of said conductive structure;
   performing at least one planarization process to remove a portion of said layer of sacrificial material and said patterned hard mask while leaving a remaining portion of said layer of sacrificial material within said cavity; and
   removing said remaining portion of said layer of sacrificial material positioned within said cavity so as to thereby expose said exposed portion of said conductive structure.

2. The method of claim 1, wherein said conductive structure is one of a metal line in a metallization layer or a conductive contact that is conductively coupled to a semiconductor device formed on a semiconductor substrate.

3. The method of claim 1, wherein said conductive structure is comprised of at least one conductive liner layer or a conductive cap layer.

4. The method of claim 1, wherein said at least one layer of insulating material is comprised of silicon dioxide or an insulating material having a k value less than 3.3.

5. The method of claim 1, wherein said patterned hard mask is comprised of at least one of titanium or titanium nitride.

6. The method of claim 1, wherein said layer of sacrificial material is comprised of a flowable oxide material.

7. The method of claim 1, wherein performing at least one planarization process comprises performing a single chemical mechanical polishing process.

8. The method of claim 1, wherein performing at least one planarization process comprises:
   performing a first chemical mechanical polishing process that stops on said patterned hard mask; and
   performing a second chemical mechanical polishing process that stops on or within said at least one layer of insulating material.

9. The method of claim 8, wherein said second chemical mechanical polishing process is a timed chemical mechanical polishing process.

10. The method of claim 1, wherein removing said remaining portion of said layer of sacrificial material positioned within said cavity comprises exposing said remaining portion of said layer of sacrificial material to a dilute HF acid treatment.

11. The method of claim 1, further comprising, after removing said remaining portion of said layer of sacrificial material, forming a second conductive structure in said cavity.

12. A method, comprising:
   forming at least one layer of insulating material having a k value less than 3.3 above a conductive structure;
   forming a patterned hard mask comprised of metal above said at least one layer of insulating material;
   performing at least one etching process through said patterned hard mask to define a cavity in said at least one layer of insulating material, wherein said cavity exposes at least a portion of said conductive structure;
   forming a layer of sacrificial material so as to overfill said cavity and cover said exposed portion of said conductive structure;

performing at least one chemical mechanical polishing process to remove a portion of said layer of sacrificial material and said patterned hard mask while leaving a remaining portion of said layer of sacrificial material within said cavity; and removing said remaining portion of said layer of sacrificial material positioned within said cavity so as to thereby expose said exposed portion of said conductive structure.

13. The method of claim 12, wherein said patterned hard mask is comprised of at least one of titanium or titanium nitride.

14. The method of claim 12, wherein said layer of sacrificial material is comprised of a flowable oxide material.

15. The method of claim 12, wherein removing said remaining portion of said layer of sacrificial material positioned within said cavity comprises exposing said remaining portion of said layer of sacrificial material to a dilute HF acid treatment.

16. The method of claim 12, wherein performing at least one planarization process comprises performing a single chemical mechanical polishing process.

17. The method of claim 12, wherein performing at least one planarization process comprises:
   performing a first chemical mechanical polishing process that stops on said patterned hard mask; and
   performing a second chemical mechanical polishing process that stops on or within said at least one layer of insulating material.

18. The method of claim 17, wherein said second chemical mechanical polishing process is a timed chemical mechanical polishing process.

19. A method, comprising:
   forming at least one layer of insulating material having a k value less than 3.3 above a conductive structure;
   forming a patterned hard mask comprised of metal above said at least one layer of insulating material;
   performing at least one etching process through said patterned hard mask to define a cavity in said at least one layer of insulating material, wherein said cavity exposes at least a portion of said conductive structure;
   forming a layer of sacrificial material comprised of flowable oxide so as to overfill said cavity and cover said exposed portion of said conductive structure;
   performing at least one chemical mechanical polishing process to remove a portion of said layer of sacrificial material and said patterned hard mask while leaving a remaining portion of said layer of sacrificial material within said cavity; and
   removing said remaining portion of said layer of sacrificial material positioned within said cavity so as to thereby expose said exposed portion of said conductive structure.

20. The method of claim 19, wherein said patterned hard mask is comprised of at least one of titanium or titanium nitride.

21. The method of claim 19, wherein removing said remaining portion of said layer of sacrificial material positioned within said cavity comprises exposing said remaining portion of said layer of sacrificial material to a dilute HF acid treatment.

22. The method of claim 19, further comprising, after removing said remaining portion of said sacrificial material layer, forming a second conductive structure in said cavity.

23. The method of claim 19, wherein performing at least one planarization process comprises performing a single chemical mechanical polishing process.

24. The method of claim 19, wherein performing at least one planarization process comprises:
   performing a first chemical mechanical polishing process that stops on said patterned hard mask; and
   performing a second chemical mechanical polishing process that stops on or within said at least one layer of insulating material.

25. The method of claim 24, wherein said second chemical mechanical polishing process is a timed chemical mechanical polishing process.

26. A method, comprising:
   forming at least one layer of insulating material having a k value less than 3.3 above a conductive structure;
   forming a patterned hard mask comprised of titanium or titanium nitride above said at least one layer of insulating material;
   performing at least one etching process through said patterned hard mask to define a cavity in said at least one layer of insulating material, wherein said cavity exposes at least a portion of said conductive structure;
   forming a layer of sacrificial material comprised of flowable oxide so as to overfill said cavity and cover said exposed portion of said conductive structure;
   performing a first chemical mechanical polishing process that stops on said patterned hard mask and removes a portion of said layer of sacrificial material while leaving a remaining portion of said layer of sacrificial material within said cavity;
   performing a second chemical mechanical polishing process that stops on or within said at least one layer of insulating material and removes said patterned hard mask; and
   removing said remaining portion of said layer of sacrificial material positioned within said cavity so as to thereby expose said exposed portion of said conductive structure.

27. The method of claim 26, wherein removing said remaining portion of said layer of sacrificial material positioned within said cavity comprises exposing said remaining portion of said layer of sacrificial material to a dilute HF acid treatment.

28. The method of claim 26, further comprising, after removing said remaining portion of said layer of sacrificial material, forming a second conductive structure in said cavity.

* * * * *